(12) United States Patent
Basker et al.

(10) Patent No.: US 11,201,242 B2
(45) Date of Patent: Dec. 14, 2021

(54) STRUCTURE TO ENABLE TITANIUM CONTACT LINER ON PFET SOURCE/DRAIN REGIONS

(71) Applicant: International Business Machines Corporation, Armonk, NY (US)

(72) Inventors: Veeraraghavan S. Basker, Schenectady, NY (US); Keith E. Fogel, Hopewell Junction, NY (US); Nicole S. Munro, Voorheesville, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/795,480

(22) Filed: Jul. 9, 2015

(65) Prior Publication Data

US 2017/0012120 A1    Jan. 12, 2017

(51) Int. Cl.
| | | |
|---|---|---|
| *H01L 29/66* | (2006.01) | |
| *H01L 29/78* | (2006.01) | |
| *H01L 29/08* | (2006.01) | |
| *H01L 29/45* | (2006.01) | |
| *H01L 29/40* | (2006.01) | |

(52) U.S. Cl.
CPC ........ *H01L 29/785* (2013.01); *H01L 29/0847* (2013.01); *H01L 29/401* (2013.01); *H01L 29/408* (2013.01); *H01L 29/45* (2013.01); *H01L 29/66795* (2013.01)

(58) Field of Classification Search
CPC . H01L 29/0847; H01L 29/401; H01L 29/408; H01L 29/45; H01L 29/66795; H01L 29/785

USPC ................. 257/314–316, 320, 369, 386, 388
See application file for complete search history.

(56) References Cited

U.S. PATENT DOCUMENTS

| | | | |
|---|---|---|---|
| 6,150,257 A | 11/2000 | Yin et al. | |
| 7,659,630 B2 | 2/2010 | Yin et al. | |
| 8,106,515 B2 | 1/2012 | Maxson et al. | |
| 8,138,605 B2 | 3/2012 | Chang et al. | |
| 8,163,571 B2 | 4/2012 | Jaeger et al. | |
| 8,492,269 B2 | 7/2013 | Heinrich et al. | |
| 8,518,819 B2 | 8/2013 | Chang et al. | |
| 2009/0289365 A1* | 11/2009 | Yang ................. | H01L 21/76846 257/751 |
| 2010/0224938 A1* | 9/2010 | Zhu ..................... | H01L 29/7833 257/369 |

(Continued)

OTHER PUBLICATIONS

List of IBM Patents or Patent Applications Treated as Related dated Feb. 10, 2020, 2 pages.

*Primary Examiner* — Meiya Li
(74) *Attorney, Agent, or Firm* — Scully, Scott, Murphy & Presser, P.C.; Daniel P. Morris, Esq.

(57) ABSTRACT

A semiconductor structure is provided that includes non-metal semiconductor alloy containing contact structures for field effect transistors (FETs), particularly p-type FETs. Notably, each non-metal semiconductor alloy containing contact structure includes a highly doped epitaxial semiconductor material directly contacting a topmost surface of a source/drain region of the FET, a titanium liner located on the highly doped epitaxial semiconductor material, a diffusion barrier liner located on the titanium liner, and a contact metal portion located on the diffusion barrier liner.

9 Claims, 8 Drawing Sheets

(56) References Cited

U.S. PATENT DOCUMENTS

| | | | |
|---|---|---|---|
| 2012/0037998 A1* | 2/2012 | Bedell | H01L 21/823807 257/369 |
| 2013/0154016 A1* | 6/2013 | Glass | H01L 29/78 257/368 |
| 2013/0221414 A1* | 8/2013 | Zhao | H01L 29/66795 257/288 |
| 2013/0277752 A1* | 10/2013 | Glass | H01L 29/66545 257/369 |
| 2014/0001520 A1* | 1/2014 | Glass | H01L 29/66795 257/288 |

* cited by examiner

US 11,201,242 B2

STRUCTURE TO ENABLE TITANIUM CONTACT LINER ON PFET SOURCE/DRAIN REGIONS

BACKGROUND

The present application relates to semiconductor technology, and more particularly to a semiconductor structure including a non-metal semiconductor alloy containing contact structure for field effect transistors (especially p-type FETs) and a method of forming the same.

Field effect transistors (FETs) are the basic building block of today's integrated circuits. Such transistors can be formed in conventional bulk substrates (such as silicon) or in semiconductor-on-insulator (SOI) substrates.

State of the art FETs can be fabricated by depositing a gate conductor over a gate dielectric and a semiconductor substrate. Generally, the FET fabrication process implements lithography and etching processes to define the gate structures. After providing the gate structures, source/drain extensions are formed into a portion of the semiconductor substrate and on both sides of each gate structure by ion implantation. Sometimes this implant is performed using a spacer to create a specific distance between the gate structure and the implanted junction. In some instances, such as in the manufacture of an nFET device, the source/drain extensions for the nFET device are implanted with no spacer. For a pFET device, the source/drain extensions are typically implanted with a spacer present. A thicker spacer is typically formed after the source/drain extensions have been implanted. In some instances, deep source/drain implants can be performed with the thick spacer present. In other instances, and for advanced technologies, the source region and the drain region can be formed using a selective epitaxial growth process.

In prior art processes, source/drain metal semiconductor alloy contacts are formed on the source region and the drain region of both the nFET and the pFET devices. The formation of source/drain metal semiconductor alloy contacts on the surface of the source region and the drain region typically requires that a transition metal be deposited on the semiconductor substrate followed by a process to produce the metal semiconductor alloy. Such a process forms source/drain metal semiconductor alloy contacts to the deep source/drain regions of both the nFET and the pFET devices.

Metal semiconductor alloy contact resistance contributes to an ever larger portion of the total parasitic resistance in advanced complementary metal oxide semiconductor (CMOS) devices for current 20 nm and 14 nm technology nodes. Thus, there is a need for providing source/drain metal contacts in which the contact resistance is reduced.

SUMMARY

A semiconductor structure is provided that includes non-metal semiconductor alloy containing contact structures for field effect transistors (FETs), particularly p-type FETs. Notably, each non-metal semiconductor alloy containing contact structure includes a highly doped epitaxial semiconductor material directly contacting a topmost surface of a source/drain region of the FET, a titanium liner located on the highly doped epitaxial semiconductor material, a diffusion barrier liner located on the titanium liner, and a contact metal portion located on the diffusion barrier liner.

In one aspect of the present application, a semiconductor structure is provided that includes a Ti liner contact for a FET (particularly a pFET). In one embodiment of the present application, the semiconductor structure includes a substrate comprising at least one semiconductor material portion. A functional gate structure is located on a surface of the at least one semiconductor material portion, wherein a source region is located on one side of the functional gate structure and a drain region is located on another side of the functional gate structure. The source region and the drain region have a first dopant concentration. Contact structures are also present that contact an exposed portion of the source region and the drain region of the functional gate structure. Each contact structures includes an epitaxial semiconductor material of a second dopant concentration that is greater than the first dopant concentration directly contacting a topmost surface of the source region or the drain region, a titanium liner located on the epitaxial semiconductor material, a diffusion barrier liner located on the titanium liner and a contact metal portion located on the diffusion barrier liner.

In another aspect of the present application, a method of forming a semiconductor structure including a Ti liner contact for FET (particularly a pFET) is provided. In one embodiment, the method includes forming a structure comprising a functional gate structure located on a surface of a semiconductor material portion of a substrate, wherein a source region is formed on one side of the functional gate structure and a drain region is formed on another side of the functional gate structure. Next, a middle-of-the-line (MOL) dielectric material is formed surrounding the functional gate structure, wherein the MOL dielectric material comprises contact openings that expose a portion of each of the source region and the drain region of the functional gate structure. Contact structures are then formed within the contact openings and contacting the exposed portion of the source region and the drain region of the functional gate structure, wherein each of the contact structures includes an epitaxial semiconductor material of a second dopant concentration that is greater than the first dopant concentration directly contacting a topmost surface of the source region or the drain region, a titanium liner located on the epitaxial semiconductor material, a diffusion barrier liner located on the titanium liner and a contact metal portion located on the diffusion barrier liner.

DETAILED DESCRIPTION

Figure 1A:
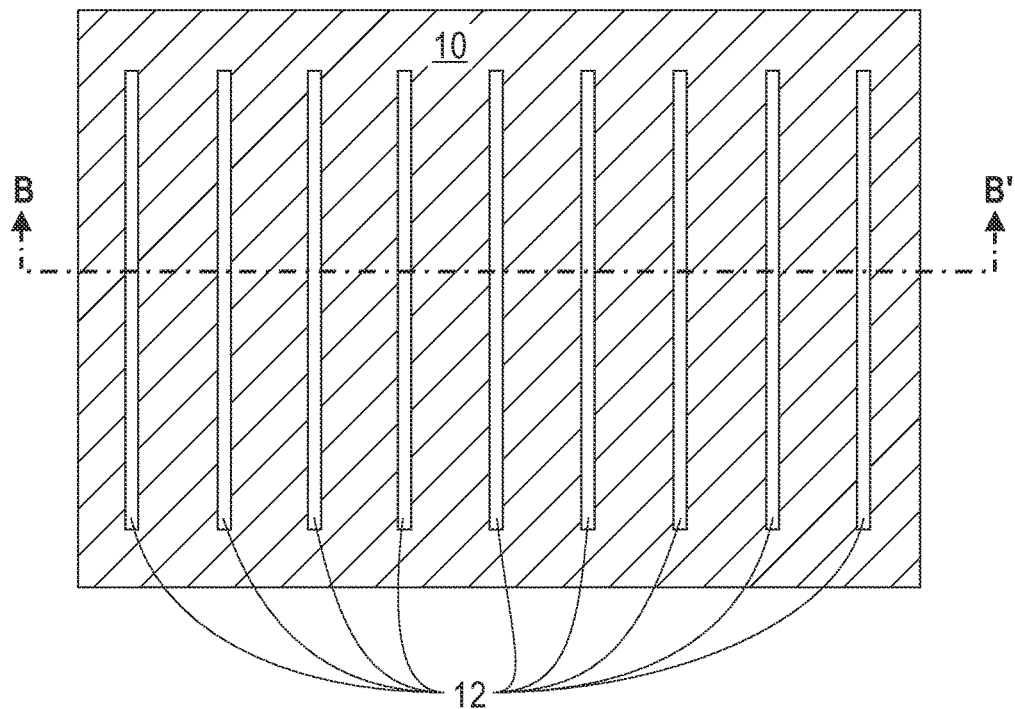
FIG. 1A is top down view of an exemplary semiconductor structure including a plurality of semiconductor fins extending upwards from a surface of a substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Titanium (Ti) liner is being suggested as a new contact material for source/drain metal contact formation since it has lower contact resistance for nFET devices and does not need to be converted into a metal semiconductor alloy. No metal semiconductor alloy formation means no material consumption which is highly desirable for merged and unmerged FinFET source/drain epitaxy contacts. Although a Ti liner is beneficial for nFET contact formation (i.e., lower resistance than a conventional metal semiconductor alloy such as, for example, Ni—Pt silicide), the Ti liner is not suitable for pFET contact because of Schottky height (Ti is an nFET contact metal and it has a very high contact resistance for pFETs). In order to reduce the Schottky height and enable Ti liners for use in pFET devices, the present application forms an epitaxially doped semiconductor material between the source/drain regions and the Ti liner. The epitaxially doped semiconductor material has a higher dopant concentration as compared to the dopant concentration within the underlying source/drain regions. The epitaxially doped semiconductor material is of the same conductivity type (p-type or n-type) as the underlying source/drain regions.

Although the following description and drawings illustrate the basic processing steps employed to form contact structures for FinFET devices, the basic concept of the present application can be applied to form contact structures for other non-planar devices such as, for example, gate all-around devices, as well as contact structures for planar semiconductor devices. When planar semiconductor devices are to be formed, a gate structure(s) (to be described in greater detail herein) is(are) formed on a semiconductor material portion(s) of a semiconductor substrate. Source/drain regions are then formed into exposed portions of the semiconductor material portion(s) at the footprint of each gate structure, and thereafter the process described herein below in connection with FIGS. 4A-10 are performed. In such an embodiment, the source/drain regions represents a first semiconductor material having a first dopant concentration and the second epitaxially doped semiconductor material of the second dopant concentration is formed atop the source/drain regions.

Figure 1B:
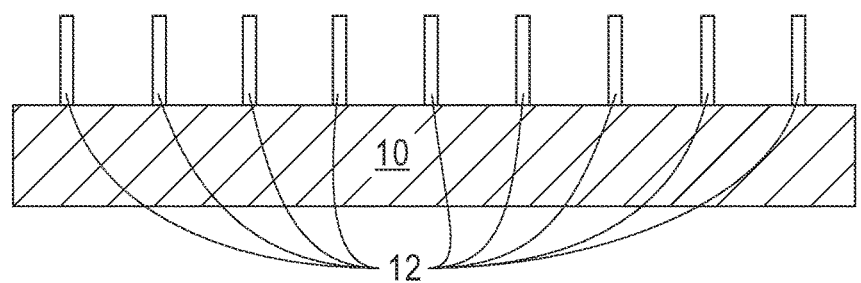
FIG. 1B is a cross sectional view of the exemplary semiconductor structure of FIG. 1A along vertical plane B-B'.

Referring first to FIGS. 1A-1B, there are illustrated an exemplary semiconductor structure including a plurality of semiconductor fins (i.e., semiconductor material portions) 12 extending upwards from a surface of a substrate 10 that can be employed in accordance with an embodiment of the present application. In one embodiment of the present application, each of the semiconductor fins 12 is present within an nFET device region or a pFET device region. In another embodiment, a first set of the semiconductor fin 12 is present within a pFET device region, while a second set of semiconductor fins is present in an nFET device region. In some embodiments, a single semiconductor fin 12 can be formed.

In one embodiment of the present application, the semiconductor fins 12 constitute an upper semiconductor material portion of a bulk semiconductor substrate, while substrate 10 constitutes a remaining portion of the bulk semiconductor structure. The term "bulk semiconductor substrate" as used throughout the present application denotes a substrate that is entirely comprised of a semiconductor material. The term "semiconductor material" as used throughout the present application denotes any semiconductor material including, for example, Si, Ge, SiGe, SiC, SiGeC, and III/V compound semiconductors such as, for example, InAs, GaAs, or InP. In some embodiments, multilayers of these semiconductor materials can also be used as the bulk semiconductor. In one embodiment, at least an upper portion of the bulk semiconductor substrate in which semiconductor fins 12 will be subsequently formed is comprised of a silicon-containing semiconductor material including, but not limited to, pure, i.e., unalloyed, silicon, or a silicon alloy such as, for example, SiGe, SiC, and/or SiGeC. In one embodiment, the upper portion of the bulk semiconductor substrate in which semiconductor fins 12 will be subsequently formed can be comprised of a single crystalline semiconductor material, such as, for example, single crystalline silicon.

In another embodiment of the present application, the semiconductor fins 12 constitute a topmost semiconductor material layer of a semiconductor-on-insulator (SOI) substrate, while substrate 10 constitutes a remaining portion of the semiconductor-on-insulator (SOI) substrate that may include a handle substrate and/or an insulator layer. In this embodiment, the topmost semiconductor material layer of the SOI substrate can be processed into the semiconductor fin 12 mentioned above. In embodiments in which an SOI substrate is employed, the SOI substrate includes, from bottom to top, a handle substrate, an insulator layer located on an upper surface of the handle substrate, and a topmost semiconductor material layer, such as a Si-containing semiconductor layer, located on an uppermost surface of the insulator layer. The handle substrate provides mechanical support for the insulator layer and the topmost semiconductor material layer. The handle substrate and the topmost semiconductor material layer of the SOI substrate may comprise the same, or different, semiconductor material. In one embodiment, at least the topmost semiconductor material layer of the SOI substrate is a Si-containing layer such as, for example, unalloyed silicon or a silicon alloy such as, for example, SiGe, SiC, SiGeC. In some embodiments, the handle substrate is a non-semiconductor material including, for example, a dielectric material and/or a conductive material. In yet other embodiments, the handle substrate can be omitted or removed and substrate 10 includes an insulator layer.

The insulator layer may be a crystalline or non-crystalline oxide or nitride. In one embodiment, the insulator layer is an oxide such as, for example, silicon dioxide. In another embodiment, the insulator layer is a nitride such as, for example silicon nitride or boron nitride. In yet other embodiments, insulator layer is a multilayered stack of, in any order, silicon dioxide and boron nitride.

The SOI substrate may be formed utilizing standard processes including for example, SIMOX (separation by ion implantation of oxygen) or layer transfer in which two wafers are bonded together.

When an SOI substrate is employed, the thickness of the topmost semiconductor material layer of the SOI substrate can be from 10 nm to 100 nm. Other thicknesses that are lesser than, or greater than, the aforementioned thickness range may also be employed as the thickness of the topmost semiconductor material layer of the SOI substrate. The insulator layer of the SOI substrate can have a thickness from 5 nm to 200 nm. Other thicknesses that are lesser than, or greater than, the aforementioned thickness range may also be employed as the thickness of the insulator layer of the SOI substrate. The thickness of the handle substrate of the SOI substrate is inconsequential to the present application.

The semiconductor fins 12, which are spaced apart from each other, can be formed by patterning either a topmost portion of a bulk semiconductor substrate or a topmost semiconductor material layer of an SOI substrate. Following the patterning process, and if needed, a semiconductor fin cut may be used. In one embodiment, the patterning process used to define each semiconductor fin 12 may include lithography and etching.

Lithography includes forming a photoresist material (not shown) on either an upper portion of a bulk semiconductor substrate or a topmost semiconductor material layer of an SOI substrate. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of either an upper portion of a bulk semiconductor substrate or a topmost semiconductor material layer of an SOI substrate. The pattern provided by the patterned photoresist material is thereafter transferred into the underlying material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment of the present application, a sidewall image transfer (SIT) process can be used as the patterning process that defines each semiconductor fin. The SIT process includes forming a contiguous mandrel material layer (not shown) over a topmost portion of a bulk semiconductor substrate or a topmost semiconductor material layer of an SOI substrate. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into an upper portion of a bulk semiconductor substrate or a topmost semiconductor material layer of an SOI substrate. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In any of the patterning processes mentioned above, a hard mask layer such as, for example, silicon dioxide and/or silicon nitride may be formed on a topmost portion of a bulk semiconductor substrate or a topmost semiconductor material layer of an SOI substrate prior to patterning. After patterning, a remaining portion of the hard mask layer is present atop each semiconductor fin that is formed. The portion of the hard mask layer that remains after patterning can be referred to herein as hard mask cap (not shown). The hard mask cap can be removed after patterning by a planarization process such as, for example, chemical mechanical planarization and/or grinding.

Each semiconductor fin 12 that is formed includes a pair of vertical sidewalls that are parallel to each other. As used herein, a surface is "vertical" if there exists a vertical plane from which the surface does not deviate by more than three times the root mean square roughness of the surface. Each semiconductor fin 12 that is formed includes a pair of sidewalls that are parallel to each other. Each semiconductor fin 12 has a width from 5 nm to 30 nm and a length from 100 nm to 2000 nm. Other widths and lengths are possible and can be used in the present application for each semiconductor fin 12.

Figure 2A:
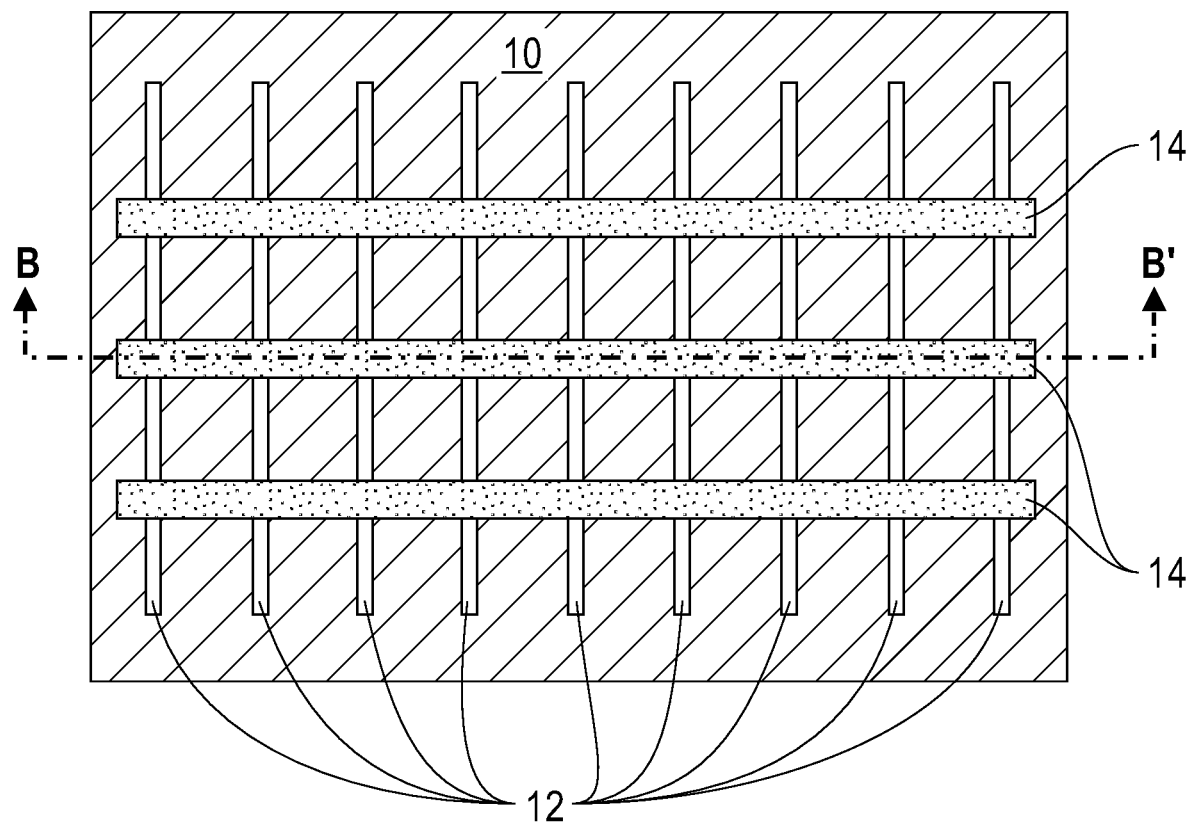
FIG. 2A is a top down view of the exemplary semiconductor structure of FIGS. 1A-1B after forming a plurality of gate structures, each gate structure straddling over a different portion of each semiconductor fin.
Figure 2B:
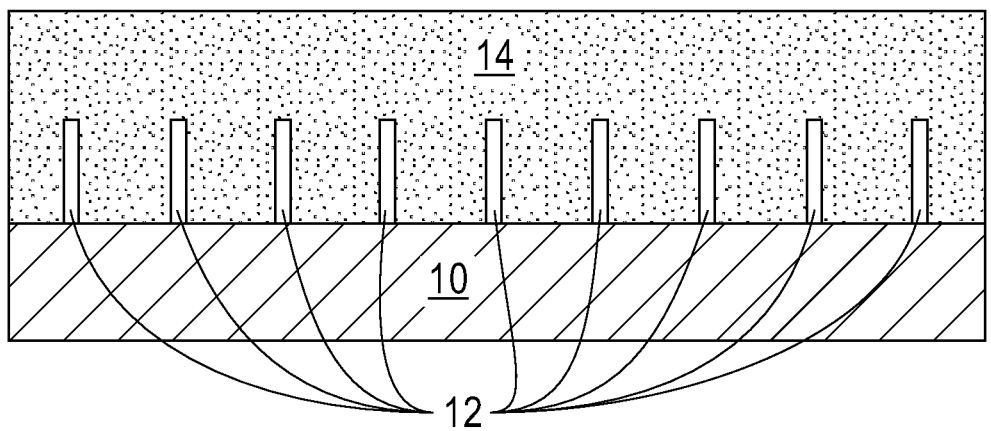
FIG. 2B is a cross sectional view of the exemplary semiconductor structure of FIG. 2A along vertical plane B-B'.

Referring now to FIGS. 2A-2B, there are illustrated the exemplary semiconductor structure of FIGS. 1A-1B after forming a plurality of gate structures 14, each gate structure 14 straddling over a different portion of each semiconductor fin 12. By "straddle over or straddling over" it is meant that at least one portion of a gate structure is located on one side of the semiconductor fin 12, while another portion of the same gate structure 14 is located on another side of the semiconductor fin. The two portions are interconnected by a portion of the gate structure 14 that is located directly atop the semiconductor fin 12. As shown, each gate structure 14 has a surface that contacts a topmost surface of substrate 10.

In one embodiment and as illustrated in the present application, the gate structure 14 is a functional gate structure. By "functional gate structure" it is meant a permanent gate structure used to control output current (i.e., flow of carriers in the channel) of a semiconducting device through electrical or magnetic fields. Each functional gate structure includes a gate material stack of, from bottom to top, a gate dielectric portion and a gate conductor portion; the individual components of the functional gate structure are not shown in the drawings of the present application. In some embodiments, a gate cap portion can be present atop the gate conductor portion.

The gate dielectric portion of the functional gate structure comprises a gate dielectric material. The gate dielectric material that provides the gate dielectric portion can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as the gate dielectric portion. In some embodiments, each gate dielectric portion of each functional gate structure comprises a same gate dielectric material. In other embodiments, the gate dielectric portion for at least one functional gate structure comprises a different gate dielectric material than the gate dielectric portion for at least one other functional gate structure.

The gate dielectric material used in providing each gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions, block mask technology can be used. In one embodiment of the present application, the gate dielectric material used in providing each gate dielectric portion can have a thickness in a range from 1 nm to 10 nm. Other thicknesses that are lesser than, or greater than, the aforementioned thickness range can also be employed for the gate dielectric material.

The gate conductor portion of the each functional gate structure comprises a gate conductor material. The gate conductor material used in providing each gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion of each functional gate structure is a same conductive material. In other embodiments, the gate conductor portion of at least one functional gate structure comprises a different gate conductor material than the gate conductor portion of at least one other functional gate structure.

The gate conductor material used in providing each gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portion of different functional gate structures, block mask technology can be used. In one embodiment, the gate conductor material used in providing each gate conductor portion has a thickness from 1 nm to 100 nm. Other thicknesses that are lesser than, or greater than, the aforementioned thickness range can also be employed for the gate conductor material used in providing the gate conductor portion.

If present, the gate cap portion of the functional gate structure comprises a gate cap material. The gate cap material that provides the gate cap portion includes a dielectric material. In one embodiment, each gate cap portion comprises silicon dioxide, silicon nitride, and/or silicon oxynitride. The dielectric material that provides the gate cap portion can be formed utilizing a conventional deposition process such as, for example, chemical vapor deposition or plasma enhanced chemical vapor deposition. The dielectric material that provides the gate cap portion can has a thickness from 5 nm to 20 nm. Other thicknesses that are lesser than, or greater than, the aforementioned thickness range can also be employed as the thickness of the dielectric material that provides the gate cap portion.

The functional gate structures that can be used as gate structures 14 can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

In other embodiments of the present application, and prior to forming functional gate structures, sacrificial gate structures (not shown) can be used as gate structures 14. In yet other embodiments, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), dielectric spacers (not shown) can be formed on exposed sidewall surfaces of the respective gate structure. The dielectric spacers may comprise one of the dielectric materials mentioned above for dielectric spacers used in the SIT process. The dielectric spacers can be formed by depositing a spacer material and thereafter a spacer etch can be performed.

Figure 3A:
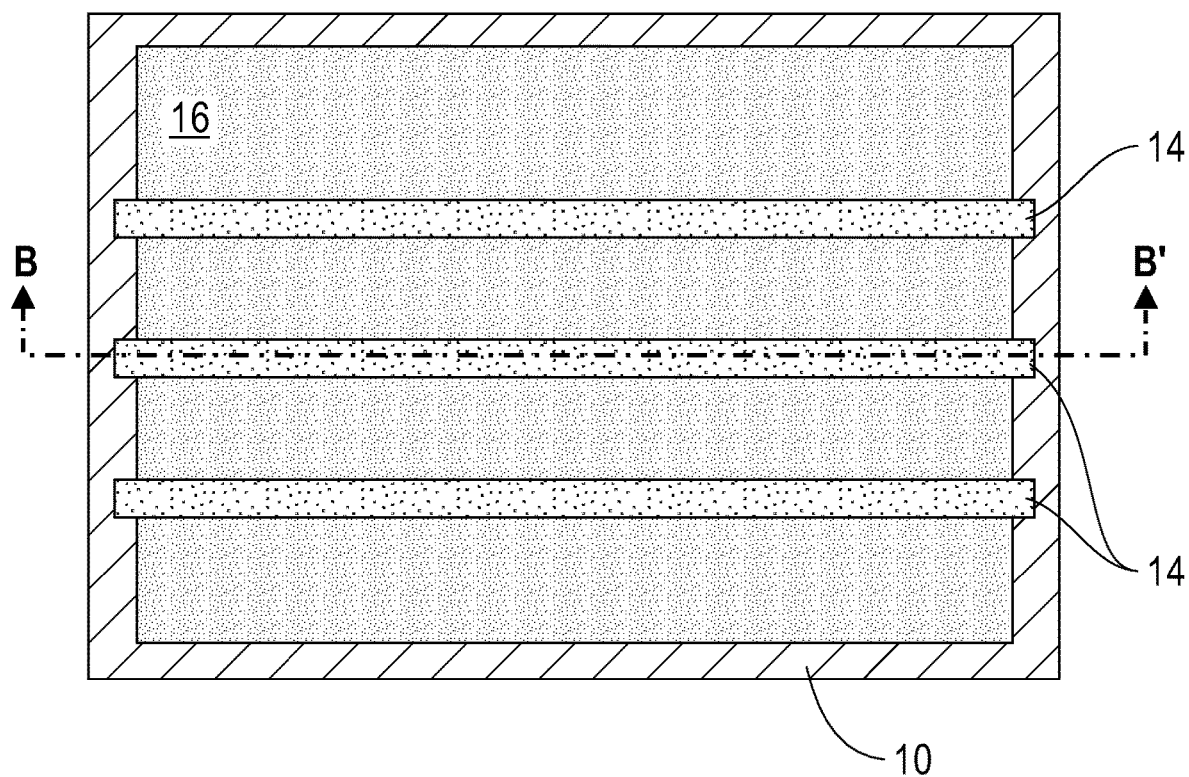
FIG. 3A is a top down view of the exemplary semiconductor structure of FIGS. 2A-2B after forming a first epitaxially doped semiconductor material having a first dopant concentration from exposed surfaces of each semiconductor fin.
Figure 3B:
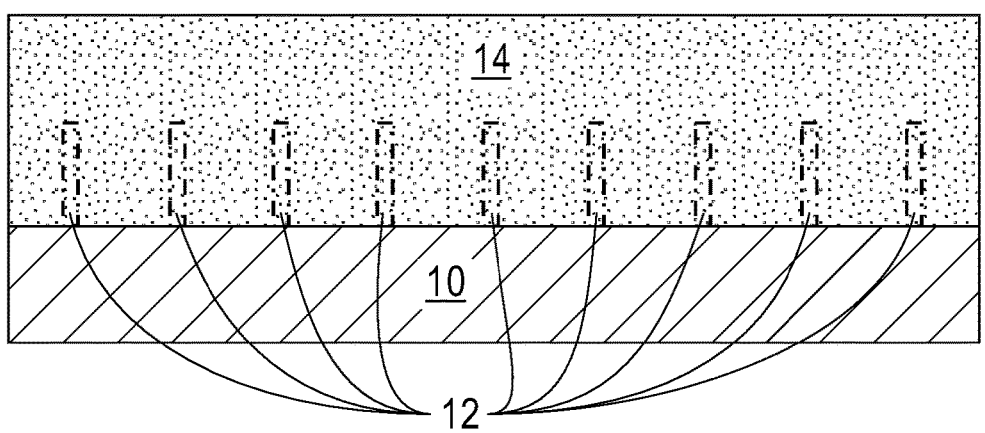
FIG. 3B is a cross sectional view of the exemplary semiconductor structure of FIG. 3A along vertical plane B-B'.

Referring now to FIGS. 3A-3B, there are illustrated the exemplary semiconductor structure of FIGS. 2A-2B after forming a first epitaxially doped semiconductor material 16 having a first dopant concentration from exposed surfaces of each semiconductor fin 12 (in FIG. 3B, the semiconductor fins 12 are drawn with dotted lines to indicate that the semiconductor fins 12 are present within (i.e., embedded within) the first epitaxially doped semiconductor material 16. In accordance with the present application, the first epitaxially doped semiconductor material 16 that is formed on one side of the gate structure 14 represents a source region of the exemplary semiconductor structure, while the first epitaxially doped semiconductor material 16 formed on the other side of the gate structure represents a drain region of the exemplary semiconductor structure.

In one embodiment and as shown, each first epitaxially doped semiconductor material 16 merges exposed portions of each semiconductor fin 12. In another embodiment (not shown), the first epitaxially doped semiconductor material 16 does not merge each semiconductor fin. Instead, a gap remains between the individual first epitaxially doped semiconductor material 16 that is formed from the exposed surfaces of each semiconductor fin 12.

The first epitaxially doped semiconductor material 16 can be formed by an epitaxial growth (or epitaxial deposition process). The terms "epitaxial growth and/or deposition" and "epitaxially formed and/or grown" mean the growth of a material on a deposition surface of a base material, in which the material being grown has the same crystalline characteristics as the deposition surface of the base material. In an epitaxial deposition process, the chemical reactants provided by the source gases are controlled and the system parameters are set so that the depositing atoms arrive at the deposition surface of the base material with sufficient energy to move around on the surface and orient themselves to the crystal arrangement of the atoms of the deposition surface of the base material. Therefore, a material that is formed by an epitaxial deposition process has the same crystalline characteristics as the deposition surface of the base material on which it is formed. For example, an epitaxial material deposited on a {100} crystal surface will take on a {100} orientation. As such, each first epitaxially doped semiconductor material 16 has an epitaxial relationship, i.e., same crystal orientation, as that of the exposed surfaces (i.e., sidewall surfaces and topmost surface) of each semiconductor fin 12.

Examples of various epitaxial growth processes that are suitable for use in forming the first epitaxially doped semiconductor material 16 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking. A number of well known semiconductor material forming precursor source gases may be used for the deposition of the first epitaxially doped semiconductor material 16. Carrier gases like hydrogen, nitrogen, helium and argon can be used.

The first epitaxially doped semiconductor material 16 comprises one of the semiconductor materials mentioned above for the bulk semiconductor substrate. In one embodiment, the first epitaxially doped semiconductor material 16 comprises a same semiconductor material as each semiconductor fin 12. In another embodiment, the first epitaxially doped semiconductor material 16 comprises a different semiconductor material than each semiconductor fin 12.

In some embodiments, an n-type or p-type dopant can be present during the epitaxial growth of the first epitaxially doped semiconductor material 16. In other embodiments, an n-type or p-type dopant can be introduced into an epitaxially grown intrinsic epitaxial semiconductor material. In such an embodiment, the n-type or p-type dopant can be introduced by ion implantation or gas phase doping. The term "p-type" refers to the addition of impurities to an intrinsic semiconductor that creates deficiencies of valence electrons. In one embodiment and when the first epitaxially doped semiconductor material 16 comprises silicon or germanium, boron, aluminum, gallium and/or indium can be used as a p-type dopant. "N-type" refers to the addition of impurities that contributes free electrons to an intrinsic semiconductor. In one embodiment and when the first epitaxially doped semiconductor material 16 comprises silicon or germanium, antimony, arsenic and/or phosphorus can be used as an n-type dopant.

As mentioned above, the first epitaxially doped semiconductor material 16 has a first dopant concentration. The first dopant concentration is of a sufficient quantity such that the first epitaxially doped semiconductor material 16 can serve as either a source region or a drain region of the exemplary semiconductor structure of the present application. In one example, the first dopant concentration of the first epitaxially doped semiconductor material 16 can be from 1E18 atoms/cm$^3$ to 2E20 atoms/cm$^3$.

The first epitaxially doped semiconductor material 16 has a topmost surface that is vertically offset and located beneath a topmost surface of each gate structure 14, yet above a topmost surface of each semiconductor fin 12. The thickness of the first epitaxially doped semiconductor material 16 can be from 5 nm to 20 nm. Other thicknesses that are lesser than, or greater than, the aforementioned thickness range may also be used in the present application as the thickness of first epitaxially doped semiconductor material 16.

Figure 4A:
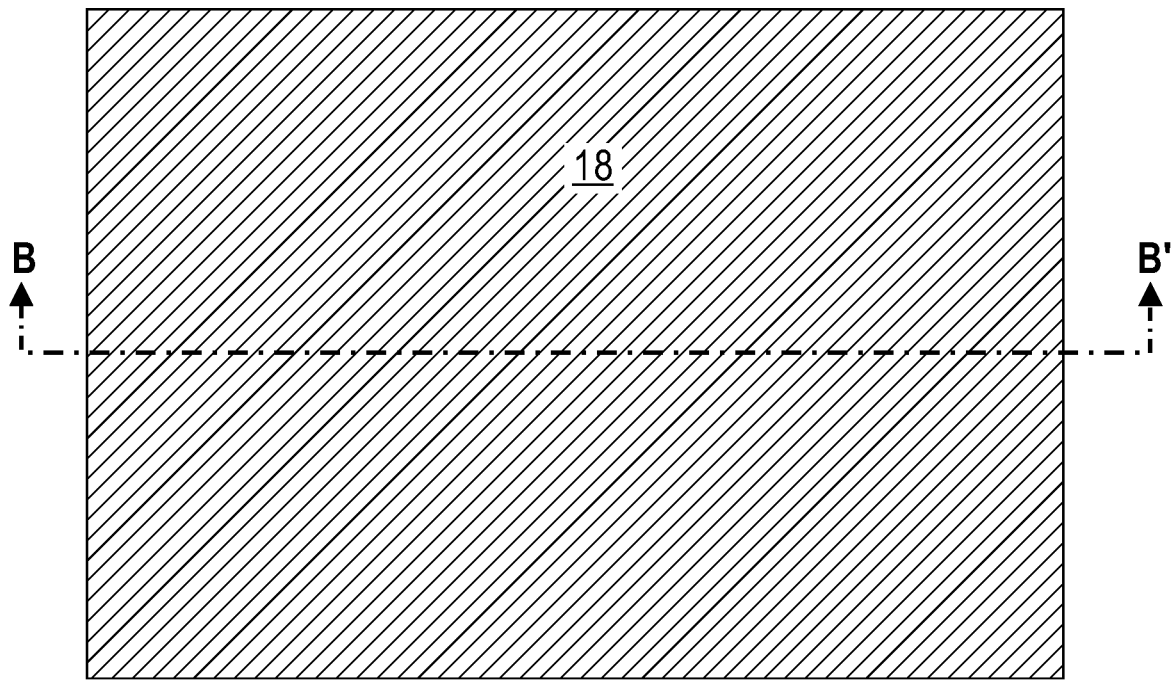
FIG. 4A is a top down view of the exemplary semiconductor structure of FIGS. 3A-3B after forming a middle-of-the-line (MOL) dielectric material.
Figure 4B:
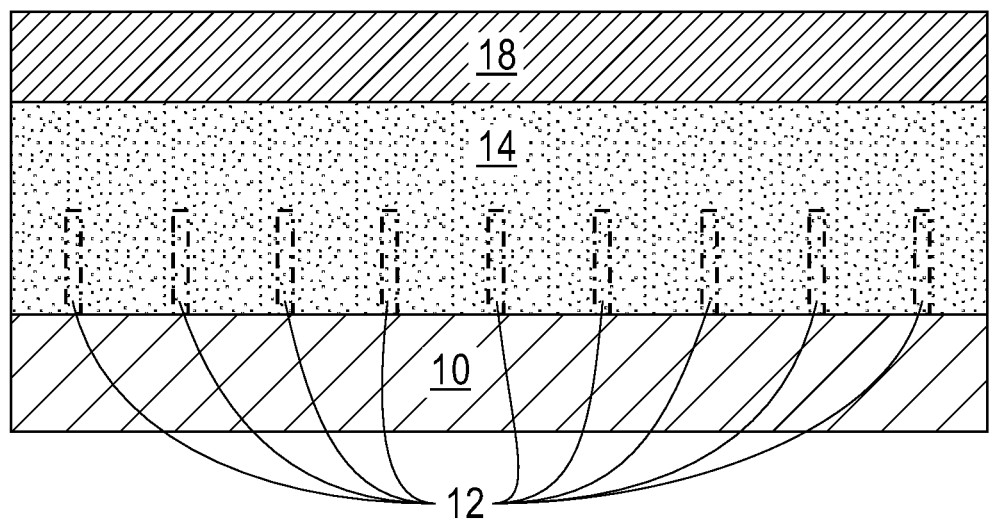
FIG. 4B is a cross sectional view of the exemplary semiconductor structure of FIG. 4A along vertical plane B-B'.

Referring now to FIGS. 4A-4B, there are illustrated the exemplary semiconductor structure of FIGS. 3A-3B after forming a middle-of-the-line (MOL) dielectric material 18. For reference and in FIG. 3B, the gate structure 14, the first epitaxially doped semiconductor material 16 and the semiconductor fins 12 are shown in FIG. 4B. However, in actuality the gate structure 14, the first epitaxially doped semiconductor material 16 and the semiconductor fins 12 would be located behind the MOL dielectric material 18 in the cross sectional view shown in FIG. 4B.

The MOL dielectric material 18 is formed surrounding the first epitaxially doped semiconductor material 16, each semiconductor fin 12 and each gate structure 14. The MOL dielectric material 18 has a height that is greater than a height of each gate structure 14. The MOL dielectric material 18 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In one embodiment, the MOL dielectric material 18 can be formed utilizing a deposition process including, for example, chemical vapor deposition (CVD), plasma enhanced chemical vapor deposition (PECVD), evaporation or spin-on coating.

Figure 5A:
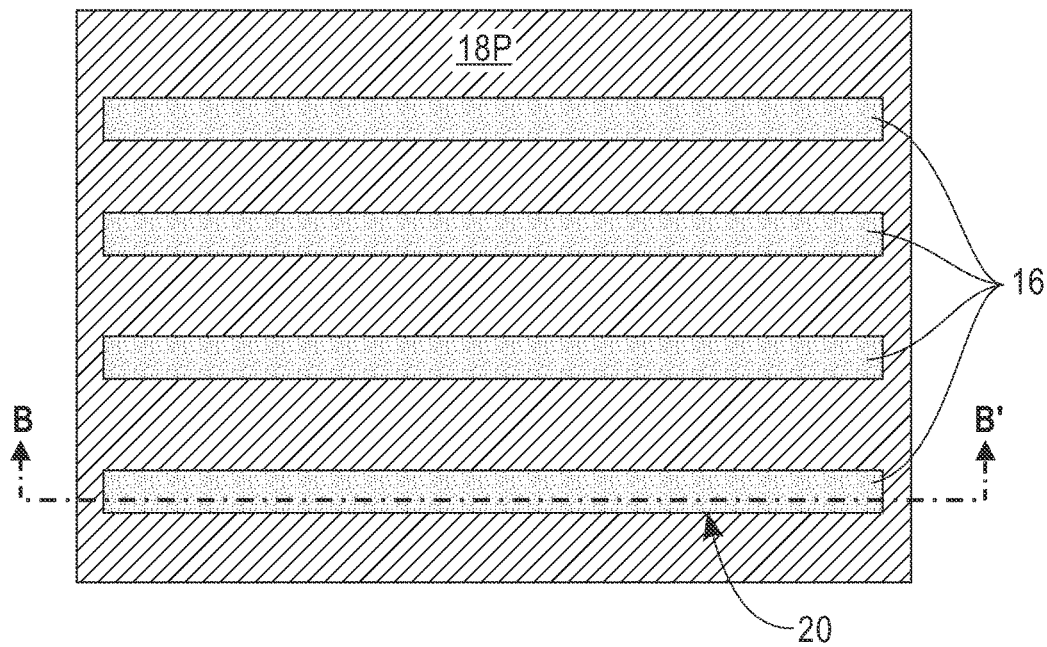
FIG. 5A is a top down view of the exemplary semiconductor structure of FIGS. 4A-4B after forming contact openings in the MOL dielectric material, each contact opening exposing a portion of the epitaxially doped semiconductor material.
Figure 5B:
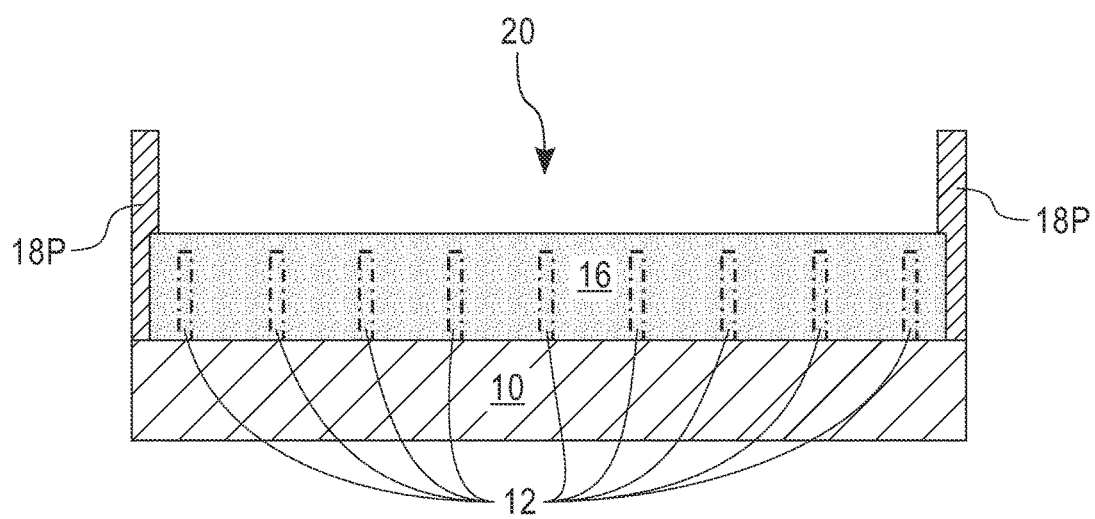
FIG. 5B is a cross sectional view of the exemplary semiconductor structure of FIG. 5A along vertical plane B-B'.

Referring now to FIGS. 5A-5B, there are illustrated the exemplary semiconductor structure of FIGS. 4A-4B after forming contact openings 20 in the MOL dielectric material 18. Although not shown in FIG. 4B, portions of MOL dielectric material 18 would be present behind and in front (i.e., running in and out of the plane of the paper) of each contact opening 20.

Each contact opening 20 exposes a portion of the epitaxially doped semiconductor material 16 on one side of the gate structure 14. Notably, a pair of contact openings 20 are formed, the first contact opening exposes the epitaxially doped semiconductor material 16 on a source-side of the gate structure 14, while the second contact opening exposes the epitaxially doped semiconductor material 16 on a drain-side of the gate structure 14. Each contact opening 20 can be formed in the MOL dielectric material 18 by lithography and etching. After etching, portions of the MOL dielectric material 18 remain. The remaining portions of the MOL dielectric material 18 can be referred to herein as MOL dielectric material portions 18P.

Figure 6A:
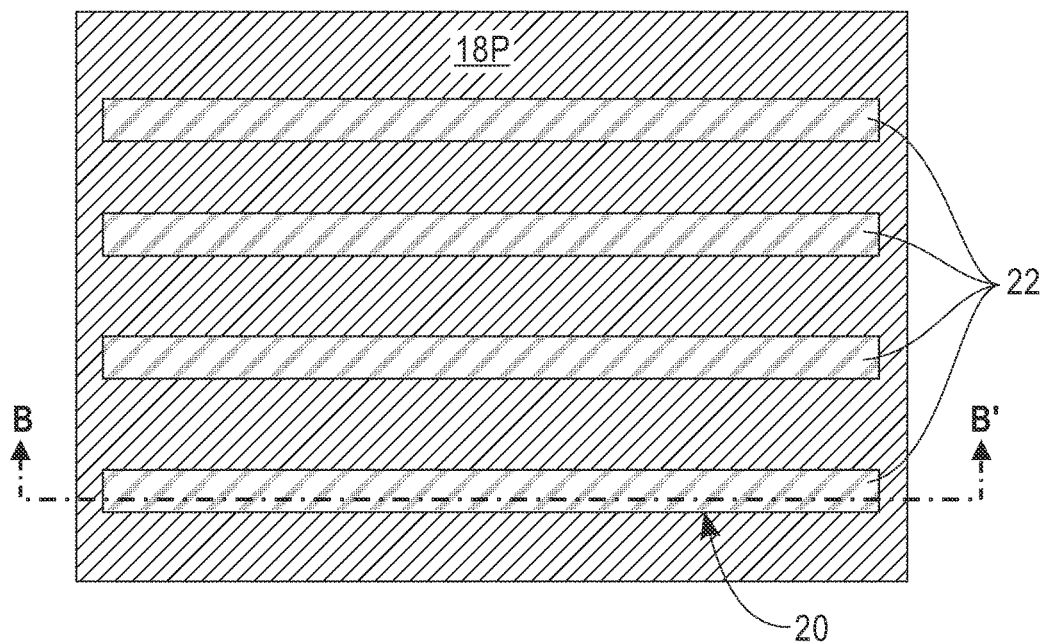
FIG. 6A is a top down view of the exemplary semiconductor structure of FIGS. 5A-5B after forming a second epitaxially doped semiconductor material having a second dopant concentration that is greater than the first dopant concentration within each contact opening and on an exposed surface of the first epitaxially doped semiconductor material.
Figure 6B:
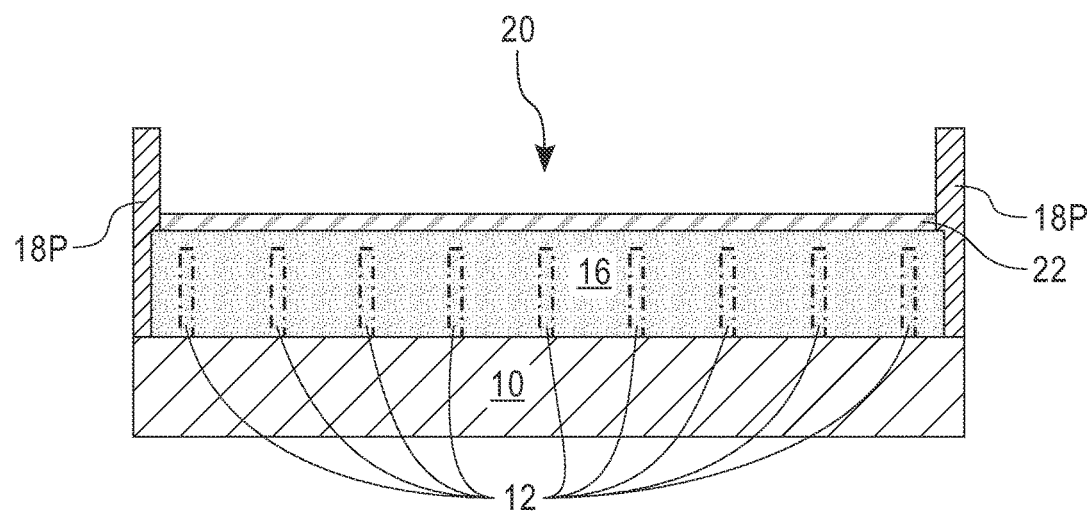
FIG. 6B is a cross sectional view of the exemplary semiconductor structure of FIG. 6A along vertical plane B-B'.

Referring now to FIGS. 6A-6B, there are illustrated the exemplary semiconductor structure of FIGS. 5A-5B after forming a second epitaxially doped semiconductor material 22 having a second dopant concentration that is greater than the first dopant concentration within each contact opening 20 and on an exposed surface of the first epitaxially doped semiconductor material 16.

The second epitaxially doped semiconductor material 22 can be formed by an epitaxial growth (or epitaxial deposition process) as defined above. As such, each second epitaxially doped semiconductor material 22 has an epitaxial relationship, i.e., same crystal orientation, as that of the exposed surfaces (i.e., sidewall surfaces and topmost surface) of the first epitaxially doped semiconductor material 16.

Examples of various epitaxial growth processes that are suitable for use in forming the second epitaxially doped semiconductor material 22 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking. A number of well known semiconductor material forming precursor source gases may be used for the deposition of the second epitaxially doped semiconductor material 22. Carrier gases like hydrogen, nitrogen, helium and argon can be used.

The second epitaxially doped semiconductor material 22 comprises one of the semiconductor materials mentioned above for the bulk semiconductor substrate. In one embodiment, the second epitaxially doped semiconductor material 22 comprises a same semiconductor material as the underlying first epitaxially doped semiconductor material 16. In another embodiment, the second epitaxially doped semiconductor material 22 comprises a different semiconductor material than the underlying first epitaxially doped semiconductor material 16.

In some embodiments, an n-type or p-type dopant can be present during the epitaxial growth of the second epitaxially doped semiconductor material 22. In other embodiments, an n-type or p-type dopant can be introduced into an epitaxially grown intrinsic epitaxial semiconductor material. In such an embodiment, the n-type or p-type dopant can be introduced by ion implantation or gas phase doping.

As mentioned above, the second epitaxially doped semiconductor material 22 has a second dopant concentration that is greater than the first dopant concentration of the underlying first epitaxially doped semiconductor material 16. In one example, the second dopant concentration of the second epitaxially doped semiconductor material 22 is greater than 2E20 atoms/cm$^3$. In one embodiment, the second dopant concentration may be from 4E20 atoms/cm$^3$ to 1.5E 21 atoms/cm$^3$. The second epitaxially doped semiconductor material 22 is of a same conductivity type as that of the underlying first epitaxially doped semiconductor material 16. In accordance with the present application, the second epitaxially doped semiconductor material 22 has a low Schottky barrier height towards titanium since the second dopant concentration provide a "metal-like' layer between the first epitaxially doped semiconductor material 16 and the titanium layer to be subsequently formed. Moreover, the second epitaxially doped semiconductor material 22 has no Schottky barrier height to the underlying first epitaxially doped semiconductor material 16 enabling a good contact for the subsequently formed titanium layer.

The thickness of the second epitaxially doped semiconductor material 22 can be from 5 nm to 20 nm. Other thicknesses that are lesser than, or greater than, the aforementioned thickness range may also be used in the present application as the thickness of second epitaxially doped semiconductor material 22 as long as the second epitaxially doped semiconductor material 22 does not completely fill in the volume of the contact opening.

Figure 7:
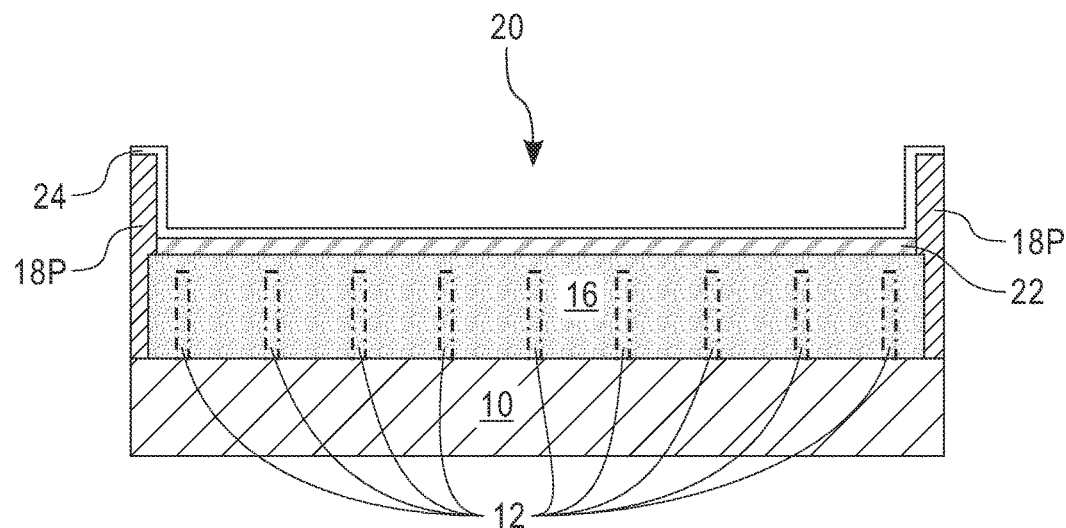
FIG. 7 is a cross sectional view of the exemplary semiconductor structure of FIGS. 6A-6B (also along vertical plane B-B' shown in FIG. 6A) after forming a titanium layer.

Referring now to FIG. 7, there is illustrated the exemplary semiconductor structure of FIGS. 6A-6B (also along vertical plane B-B' shown in FIG. 6A) after forming a titanium layer 24. The titanium layer 24 is a contiguous layer that covers the entirety of the exposed surfaces shown in FIGS. 6A-6B. Notably, the titanium layer 24 is formed on the exposed topmost surface of each MOL dielectric material portion 18P, on exposed sidewall surfaces of each MOL dielectric material portion 18P within contact opening 20 and on an exposed topmost surface of the second epitaxially doped semiconductor material 22.

The titanium layer 24 can be formed by a deposition process such as, for example, chemical vapor deposition (CVD), plasma enhanced chemical vapor deposition (CVD), atomic layer deposition (ALD), physical vapor deposition (PVD), sputtering, chemical solution deposition, or plating. The titanium layer 24 that is deposited may have a thickness from 2 nm to 50 nm. Other thicknesses that are greater than, or lesser than, the aforementioned thickness range can also be used for the thickness of the titanium layer 24 as long as a contiguous titanium layer 24 is formed and as long as the titanium layer 24 does not entirely fill the contact opening 20.

Figure 8:
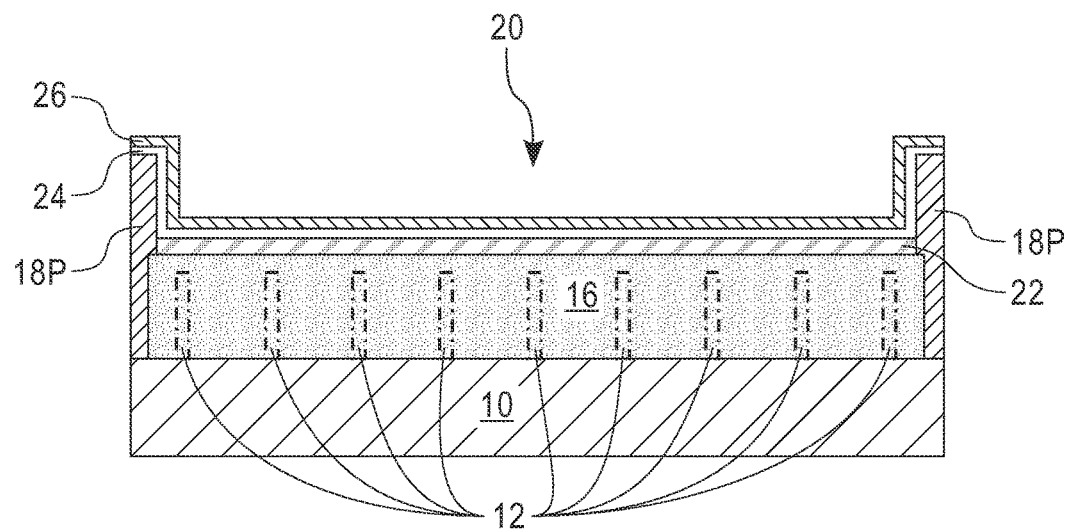
FIG. 8 is a cross sectional view of the exemplary semiconductor structure of FIG. 7 (also along vertical plane B-B') after forming a diffusion barrier layer.

Referring now to FIG. 8, there is illustrated the exemplary semiconductor structure of FIG. 7 (also along vertical plane B-B') after forming a diffusion barrier layer 26. The diffusion barrier layer 26 is a contiguous layer that covers an entirety of the underlying titanium layer 24.

The diffusion barrier layer 26 may comprise a diffusion barrier material or combination of diffusion barrier materials that prevent a conductive material (such as a conductive metal to be subsequently formed) from diffusing therethrough. Examples of materials that can be used as the diffusion barrier layer 26 include, but are not limited to, tantalum (Ta), tantalum nitride (TaN), titanium nitride (TiN), ruthenium (Ru), ruthenium nitride (RuN), ruthenium tantalum nitride (RuTaN), W (tungsten), tungsten nitride (WN) and any combination thereof. In one example, the diffusion barrier layer 26 comprises TiN. The diffusion barrier layer 26 can be formed by a deposition process such as, for example, chemical vapor deposition (CVD), plasma enhanced chemical vapor deposition (CVD), atomic layer deposition (ALD), physical vapor deposition (PVD), sputtering, chemical solution deposition, or plating. The diffusion barrier layer 26 that is deposited may have a thickness from 2 nm to 50 nm. Other thicknesses that are greater than, or lesser than, the aforementioned thickness range can also be used for the thickness of the diffusion barrier layer 26 as long as a contiguous diffusion barrier material is formed and as long as the diffusion barrier layer 26 does not entirely fill contact opening 20.

Figure 9:
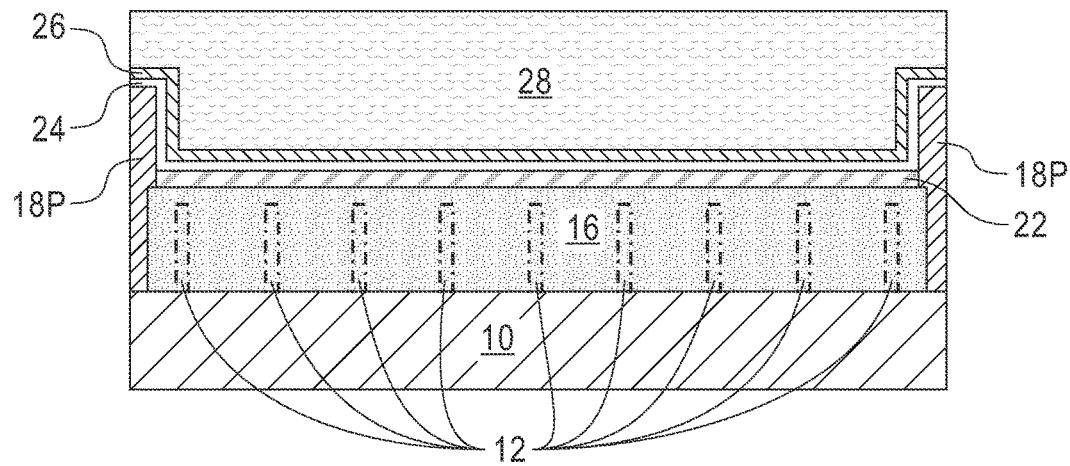
FIG. 9 is a cross sectional view of the exemplary semiconductor structure of FIG. 8 (also along vertical plane B-B') after forming a conductive metal.

Referring now to FIG. 9, there is illustrated the exemplary semiconductor structure of FIG. 8 (also along vertical plane B-B') after forming a conductive metal 28. As is shown, the conductive metal 28 is formed on the diffusion barrier layer 26 and the conductive metal 28 is present in and outside the contact opening 20.

The conductive metal 28 includes a conductive material other than the material or materials used as the diffusion barrier layer 26. Exemplary conductive materials that can be employed in providing the conductive metal 28 include at least one of copper (Cu), tungsten (W), aluminum (Al) and alloys thereof such as, for example, a copper-aluminum alloy. In one embodiment, the conductive metal 28 comprises copper or a copper alloy such as, for example, a copper-aluminum alloy. The conductive material used in providing the conductive metal 28 may be formed by a deposition process including chemical vapor deposition (CVD), plasma enhanced chemical vapor deposition (PECVD), sputtering, or chemical solution deposition. Alternatively, a plating process that fills the contact opening 20 from the bottom upwards can be used.

Figure 10:
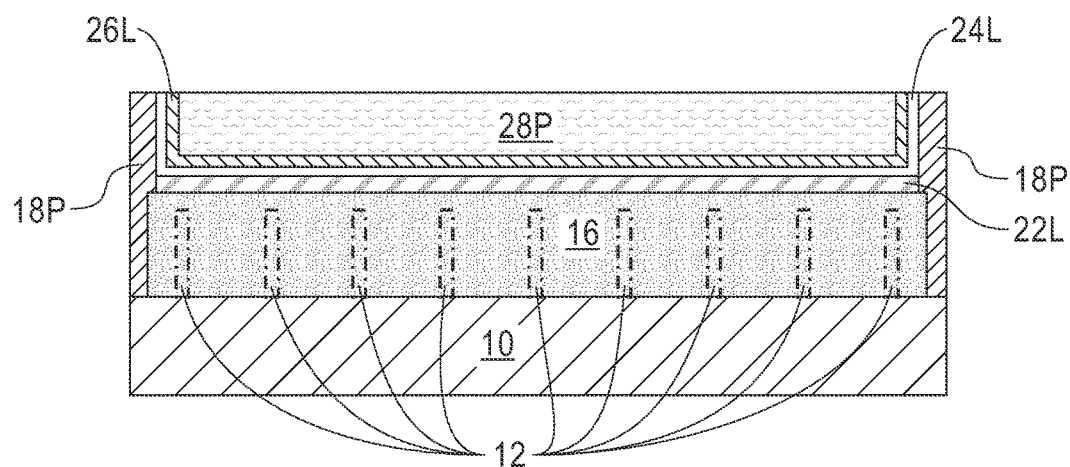
FIG. 10 is a cross sectional view of the exemplary semiconductor structure of FIG. 9 (also along vertical plane B-B') after performing a planarization process.

Referring now to FIG. 10, there is illustrated the exemplary semiconductor structure of FIG. 9 (also along vertical plane B-B') after performing a planarization process. The planarization process removes all material outside the contact opening 20 and stops at a topmost surface of each MOL dielectric material portion 18P. The planarization process that can be used in the present application may include chemical mechanical polishing (CMP) and/or grinding. The planarization process removes portions of conductive metal 28, portions of the diffusion barrier layer 26, and portions of the titanium layer 24 that extend outside and above the mouth of the contact opening 20.

The remaining portion of the conductive metal 28 constitutes a metal contact portion 28P of the present application. The remaining portion of the diffusion barrier layer 26 constitutes a diffusion barrier liner 26L. The remaining portion of the titanium layer 24 constitutes a titanium liner 24L of the present application. As is shown in FIG. 10, a contact structure (i.e., nFET contact structure) is provided that includes, from bottom to top, the second epitaxially doped semiconductor material 22, titanium liner 24L, diffusion barrier liner 26L, and metal contact portion 28P. In this embodiment, topmost surfaces of each of titanium liner 24L, diffusion barrier liner 26L, and metal contact portion 28P are coplanar with each other as well as being coplanar with a topmost surface of each MOL dielectric material portion 18P. As shown, the second epitaxially doped semiconductor material 22 is in direct contact with the first epitaxially doped semiconductor material 16 and is buried beneath the titanium liner 24L.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure, comprising:
   a substrate including at least one semiconductor material portion;
   a functional gate structure located on said at least one semiconductor material portion;
   a source region located on a first portion of said at least one semiconductor material portion not covered by the functional gate structure, and laterally adjacent to a first side of the functional gate structure;

a drain region located on a second portion of said at least semiconductor material portion not covered by the functional gate structure, and laterally adjacent to a second side of the functional gate structure, wherein said source region and said drain region are both composed of a first epitaxially doped semiconductor material having a first dopant concentration;

a source-side contact structure contacting said source region, wherein said source-side contact structure is entirely devoid of a source-side metal semiconductor alloy and consists of a source-side second epitaxially doped semiconductor material having a second dopant concentration greater than said first dopant concentration, and directly contacting a topmost surface of said source region, a source-side U-shaped titanium liner having a horizontal portion located directly on a topmost surface of said source-side second epitaxially doped semiconductor material, a source-side U-shaped diffusion barrier liner located directly on said source-side U-shaped titanium liner, and a source-side contact metal portion located directly on said source-side U-shaped diffusion barrier liner, wherein said source-side U-shaped titanium liner has a topmost surface that is coplanar with a topmost surface of each of said source-side U-shaped diffusion barrier liner and said source-side contact metal portion, and said source-side contact metal portion is entirely spaced apart from said source-side U-shaped titanium liner by said source-side U-shaped diffusion barrier liner;

a drain-side contact structure contacting said drain region, wherein said drain-side contact structure is entirely devoid of a drain side metal semiconductor alloy and consists of a drain-side second epitaxially doped semiconductor material having said second dopant concentration, and directly contacting a topmost surface of said drain region, a drain-side U-shaped titanium liner having a horizontal portion located directly on a topmost surface of said drain-side second epitaxially doped semiconductor material, a drain-side U-shaped diffusion barrier liner located directly on said drain-side U-shaped titanium liner, and a drain-side contact metal portion located directly on said drain-side U-shaped diffusion barrier liner, wherein said drain-side U-shaped titanium liner has a topmost surface that is coplanar with a topmost surface of each of said drain-side U-shaped diffusion barrier liner and said drain-side contact metal portion, and said drain-side contact metal portion is entirely spaced apart from said drain-side U-shaped titanium liner by said drain-side U-shaped diffusion barrier liner; and a middle-of-the-line (MOL) dielectric material surrounding said functional gate structure, wherein said source-side contact structure, said drain-side contact structure and said first epitaxially doped semiconductor material of both said source region and said drain region are entirely embedded in said MOL dielectric material.

2. The semiconductor structure of claim 1, wherein said at least one semiconductor material portion is a semiconductor fin extending upwards from a surface of said substrate, and wherein said functional gate structures straddles over a portion of said semiconductor fin.

3. The semiconductor structure of claim 1, wherein a topmost surface of said MOL dielectric material is coplanar with said topmost surface of each of said source-side U-shaped titanium liner and said drain-side U-shaped titanium liner, said source-side U-shaped diffusion barrier liner and said drain-side U-shaped diffusion barrier liner, and said source-side contact metal portion and said drain-side contact metal portion.

4. The semiconductor structure of claim 1, wherein said source-side second epitaxially doped semiconductor material is entirely buried beneath said source-side U-shaped titanium liner, said source-side U-shaped diffusion barrier liner, and said source-side contact metal portion, and said drain-side second epitaxially doped semiconductor material is entirely buried beneath said drain-side U-shaped titanium liner, said drain-side U-shaped diffusion barrier liner, and said drain-side contact metal portion.

5. The semiconductor structure of claim 1, wherein said first dopant concentration is from 1E18 atoms/cm$^3$ to 2E20 atoms/cm$^3$, and said second dopant concentration is greater than 2E20 atoms/cm$^3$.

6. The semiconductor structure of claim 1, wherein said at least one semiconductor material portion is in a pFET device region.

7. The semiconductor structure of claim 1, wherein said source-side second epitaxially doped semiconductor material has an epitaxial relationship with said first epitaxially doped semiconductor material of said source region, and said drain-side second epitaxially doped semiconductor material has an epitaxial relationship with said first epitaxially doped semiconductor material of said drain region.

8. The semiconductor structure of claim 1, wherein said source-side contact metal portion comprises a conductive material that differs from a material of said source-side U-shaped diffusion barrier liner, and said drain-side contact metal portion comprises a conductive material that differs from a material of said drain-side U-shaped diffusion barrier liner.

9. A semiconductor structure, comprising:
a substrate including at least one semiconductor material portion;
a functional gate structure located on said at least one semiconductor material portion;
a source region located on a first portion of said at least semiconductor material portion not covered by the functional gate structure, and laterally adjacent to a first side of the functional gate structure;
a drain region located on a second portion of said at least semiconductor material portion not covered by the functional gate structure, and laterally adjacent to a second side of the functional gate structure, wherein said source region and said drain region are both composed of a first epitaxially doped semiconductor material having a first dopant concentration;
a source-side contact structure contacting an exposed portion of said source region, wherein said source-side contact structure is entirely devoid of a source-side metal semiconductor alloy and consists of a source-side second epitaxially doped semiconductor material having a second dopant concentration greater than said first dopant concentration, and directly contacting a topmost surface of said source region, a source-side titanium liner located on said source-side second epitaxially doped semiconductor material, a source-side diffusion barrier liner located on said source-side titanium liner and a source-side contact metal portion located on said source-side diffusion barrier liner;
a drain-side contact structure contacting an exposed portion of said drain region, wherein said drain-side contact structure is entirely devoid of a drain-side metal semiconductor alloy and consists of a drain-side second epitaxially doped semiconductor material having the second dopant concentration, and directly contacting a topmost surface of said drain region, a drain-side titanium liner located on said drain-side second epitaxially doped semiconductor material, a drain-side diffusion barrier liner located on said drain-side titanium liner, and a drain-side contact metal portion located on said drain-side diffusion barrier liner; and a middle-of-the-line (MOL) dielectric material surrounding said functional gate structure, wherein said source-side contact structure, said drain-side contact structure and said first epitaxially doped semiconductor material of both said source region and said drain region are entirely embedded in said MOL dielectric material.

* * * * *